United States Patent [19]
Christensen et al.

[11] Patent Number: 4,885,792
[45] Date of Patent: Dec. 5, 1989

[54] AUDIO MIXER ARCHITECTURE USING VIRTUAL GAIN CONTROL AND SWITCHING

[75] Inventors: Donald R. Christensen, Grass Valley; Robert Bateman, Nevada City; Thomas A. Grancey, Grass Valley, all of Calif.

[73] Assignee: The Grass Valley Group, Inc., Nevada City, Calif.

[21] Appl. No.: 263,148

[22] Filed: Oct. 27, 1988

[51] Int. Cl.$^4$ .............................................. H04B 1/00
[52] U.S. Cl. .................................................... 381/119
[58] Field of Search .................. 381/98, 103, 119, 123

[56] References Cited

U.S. PATENT DOCUMENTS

| | | | |
|---|---|---|---|
| 3,992,584 | 11/1976 | Dugan | 381/119 |
| 4,357,492 | 11/1982 | Campbell et al. | 381/119 |
| 4,374,300 | 2/1983 | Ponto et al. | 381/119 |
| 4,479,240 | 10/1984 | McKinley, Jr. | 381/119 |
| 4,635,288 | 1/1987 | Stadius | 381/119 |

FOREIGN PATENT DOCUMENTS 2140248 11/1984 United Kingdom ................ 381/119

*Primary Examiner*—Forester W. Isen
*Attorney, Agent, or Firm*—Francis I. Gray

[57] ABSTRACT

An audio mixer architecture using virtual gain and switching has a single gain stag in each audio input signal path. A plurality of audio input signals are input to respective audio input channels having two or more active gain elements at the output to provide parallel signal paths for each audio input signal. The audio signals from the active gain elements are combined to form up to four audio output channels in any desired combination of audio input signals. The individual audio input signal gains and the master audio output signal gains are synthesized together as a single gain control signal for each active gain element to simulate successive gain stages for each audio input signal path within a single gain stage for that path.

6 Claims, 3 Drawing Sheets

AUDIO MIXER ARCHITECTURE USING VIRTUAL GAIN CONTROL AND SWITCHING

BACKGROUND OF THE INVENTION

The present invention relates to audio mixers, and particularly to an audio mixer architecture using virtual gain control and switching with a single active gain source in any one audio signal path that is controlled to provide both individual input gain control and overall master gain control.

Audio mixer architectures have traditionally had individual gain controls for each audio channel input to the mixer. The inputs in turn are combined to form various subcombination inputs that each have their own gain control, and finally the output of the mixer is controlled by a master gain control. For manual operation these gain controls have been in the form of variable resistors such as slides and potentiometers. However, in order to automate operation of an audio mixer, motorized variable resistors were used. This was a bulky alternative as well as producing unwanted noise in the audio signal path. With the advent of microprocessors some manufacturers have replaced the variable resistors with voltage controlled attenuators (VCA), the microprocessor providing the gain control voltage in response to the position of the variable resistors. VCAs in turn introduce noise and distortion into the audio path, especially when the gain is other than unity, that is cumulative as the audio signal passes through successive stages.

What is desired is an audio mixer architecture that has automatic capabilities without having successive stages of voltage controlled attenuators in the audio signal path.

SUMMARY OF THE INVENTION

Accordingly the present invention provides an audio mixer architecture using virtual gain control and switching to limit the number of voltage controlled attenuators in an audio channel signal path to one. An individual gain control signal is generated for each input audio channel of an audio mixer by a microprocessor in response to the position of a variable resistor. The input audio signal is input in parallel to a plurality of voltage controlled attenuators that are controlled by a gain control signal from the microprocessor. The gain control signal is applied to the VCAs to either turn off selected ones of the VCAs, or to pass the audio input signal with a desired gain to a desired subcombination point. The desired gain for the subcombination point is synthesized by the microprocessor and added to the individual gain control signal, as is a master gain signal, to produce the gain control signal. The resulting gain control signal therefore represents the net effect of the input audio signal passing through three successive gain stages although only one gain stage is implemented in hardware. The result is an audio mixer architecture that eliminates switches and reduces noise and distortion caused by multiple successive gain stages.

The objects, advantages and other novel features of the present invention are apparent from the following detailed description when read in conjunction with the appended claims and attached drawing.

DESCRIPTION OF THE PREFERRED EMBODIMENT

Figure 1:
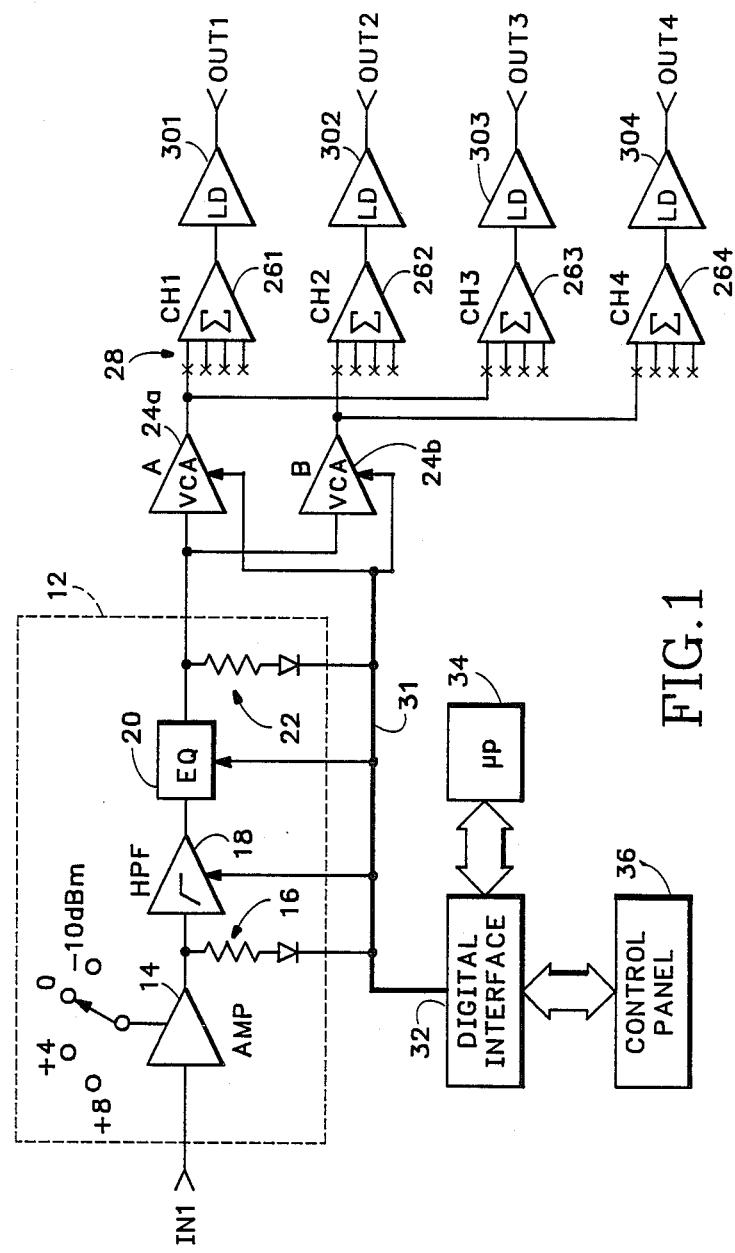
FIG. 1 is a block diagram of an audio mixer architecture according to the present invention.

Referring now to FIG. 1 one of a plurality of conventional audio input channels is shown having an audio input signal IN1. The audio input signal IN1 is input to the conventional audio input channel 12 having an input buffer amplifier 14, a first peak detector 16, a high pass filter 18, an equalizer 20 and a second peak detector 22. The input buffer amplifier 14 is set for the nominal zero level of the audio input signal, the high pass filter 18 removes undesirable low frequency artifacts from the audio signal, the equalizer 20 provides gain trim for qualitatively adjusting the audio signal, and the peak detectors 16, 22 monitor the audio signal for clipping. The resulting audio signal is input in parallel to a pair of voltage controlled attenuators (VCA) 24a, 24b. The outputs of the VCAs are input to respective summers 261, 262, 263, 264 via switching network 28. The summers 261, 262, 263, 264 combine the audio signals from the audio input channels according to the status of the crosspoints of the switching network 28. The outputs of the summers 261, 262, 263, 264 are input to respective line drivers 301, 302, 303, 304 to provide four channels of audio output OUT1, OUT2, OUT3, OUT4.

Figure 2:
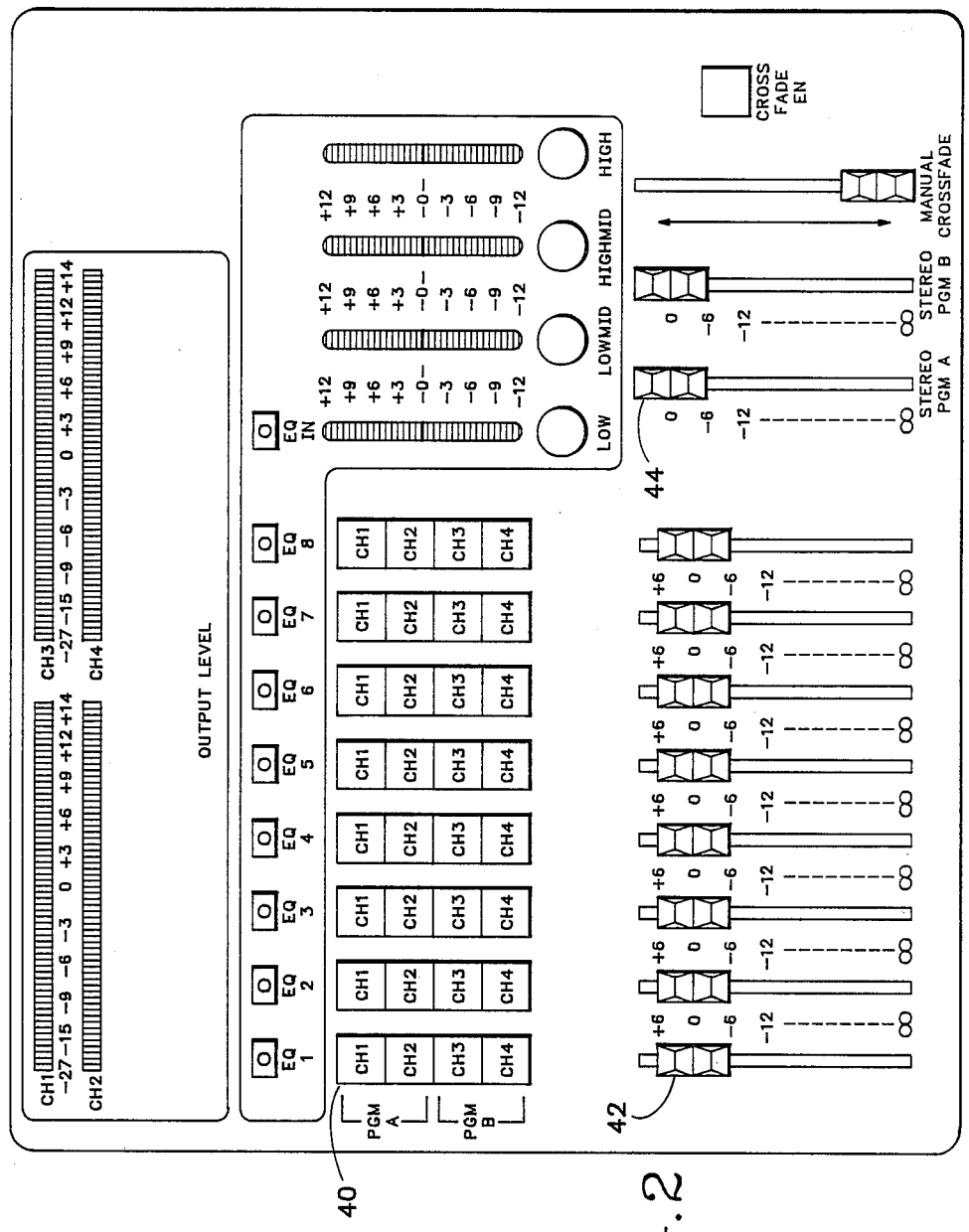
FIG. 2 is a plan view of a control panel for an audio mixer according to the present invention.

The peak detectors 16, 22, the high pass filter 18, the equalizer 20 and the VCAs 24a, 24b are all connected via an analog bus 31 to a digital interface 32 that performs the necessary analog to digital and digital to analog conversions to transmit data to and from a microprocessor 34. An operator also interfaces with the microprocessor 34 via a control panel 36 that includes appropriate controls as shown in FIG. 2 to input the necessary gain information to synthesize a gain control signal for the VCAs 24a, 24b. Push-button switches 40 correspond to the crosspoints of the switch network 28 to enable the output of each audio input channel to be coupled to a desired one or more of four output channels. Two output channels make up a stereo pair so that output channels 1 and 2 form stereo program A and output channels 3 and 4 form stereo program B. Thus an operator, by pressing CH1 for the first audio input channel would connect that audio input signal via VCA 24a to the channel one summer 261. The operator could then adjust the level for that audio input channel by moving a slider 42 that provides an input gain control value for the microprocessor 34 for VCA 24a. The operator could also adjust the level for all the audio input channels connected to output channels 1 and 2 by moving a slider 44 that acts as a master gain control for those output channels and provides a master gain control value for the microprocessor 34 for all VCAs coupled to those output channels. Thus the gain control signal applied by the microprocessor 34 via the digital interface 32 to VCA 24a is the sum of the input gain control for that audio input channel and the master gain control for stereo program A.

Figure 3:
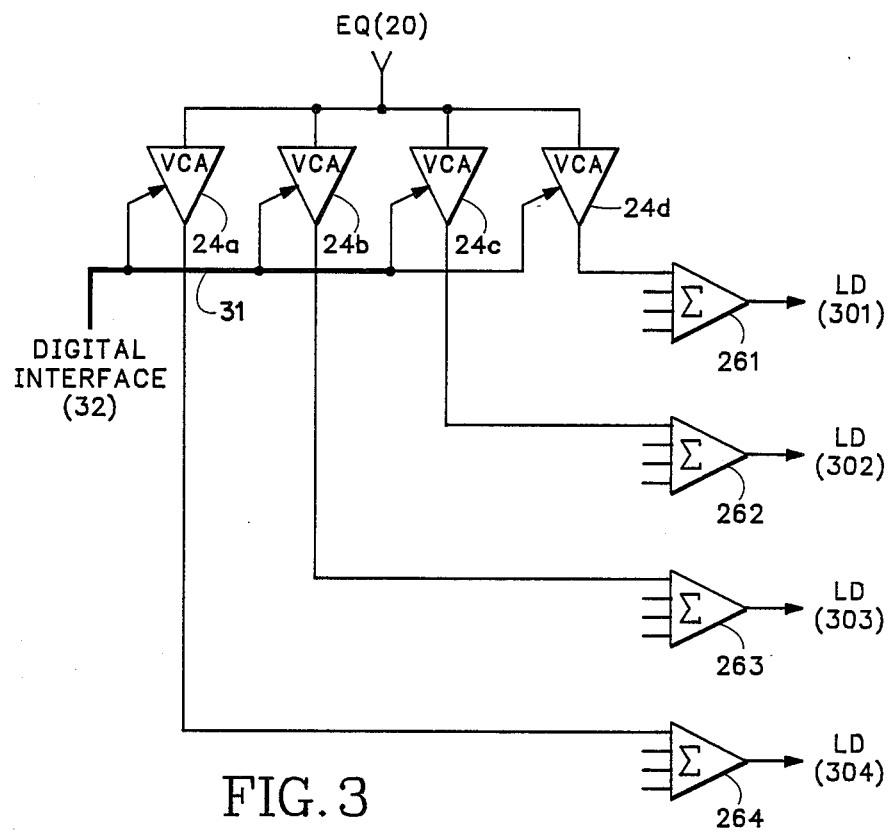
FIG. 3 is a block diagram of an alternate embodiment of an audio mixer architecture according to the present invention.

Referring now to FIG. 3 the switching network 28 may be completely eliminated by applying the audio input signal in parallel to four VCAs 24a, 24b, 24c, 24d, the outputs of which are respectively input to the summers 261, 262, 263, 264 to provide the four output channels. The operation of the push-buttons 40 causes the microprocessor 34 to generate a gain control signal as described above for the appropriate VCA 24, while the VCAs not selected are provided with a "cut" gain control signal that effectively prevents the audio input signal from passing through that VCA to the summer. In either situation there is only one VCA in an audio signal path so that the noise and distortion caused by successive gain stages is minimized, and the gain control voltage of the VCA is equivalent to that for a plurality of successive gain stages.

Although the present invention is described using a microprocessor to generate the VCA gain control signal from digitized d.c. control signals from the control panel, the gain synthesizing may be done also with operational amplifiers having as inputs the various channel d.c. control signals, the subcombination d.c. control signals and the master d.c. control signal. The operational amplifiers for each VCA perform the appropriate summing and shaping of the control signals equivalent to that performed by the microprocessor. In either event there is only a single VCA in any audio path, with the control signal applied being a synthesis of the individual, subcombination and master control signals.

Thus the present invention provides an audio mixer architecture using virtual gain and switching by inputting the audio input signal from each audio input channel in parallel to a plurality of VCAs, with the output of the VCAs being input to respective summers, the gain control voltage for the VCAs being synthesized by a microprocessor from operator inputs for individual input channel gains and for a master output channel gain.

What is claimed is:

1. An audio mixer architecture comprising:
   means for receiving a plurality of audio input signals to produce a corresponding plurality of processed audio input signals;
   means for individually controlling, in response to a respective gain control signal, the gain of each processed audio input signal to produce a plurality of attenuated audio input signals;
   means for combining the attenuated audio input signals into a plurality of audio output signals; and
   means for providing an overall attenuation for each audio output signal by synthesizing a master gain control signal for each audio output signal and an individual gain control signal for each processed audio input signal that are combined to produce each respective gain control signal.

2. An audio mixer as recited in claim 1 wherein the receiving means comprises a plurality of audio input channels, each having respective ones of the audio input signals as inputs and providing a corresponding one of the processed audio input signal.

3. An audio mixer as recited in claim 1 wherein the controlling means comprises a plurality of active gain elements for each processed audio input signal, the processed audio input signal being input in parallel to each active gain element, each active gain element having a separate respective gain control signal as its gain control signal.

4. An audio mixer as recited in claim 1 wherein the combining means comprises a plurality of summers corresponding to the plurality of audio output signals and having as inputs one of the attenuated audio input signals corresponding to each audio input signal.

5. An audio mixer as recited in claim 4 wherein the combining means further comprises a switching network interposed between the attenuated audio input signals and the summers to select the ones of the attenuated audio input signals that are input to each summer.

6. An audio mixer as recited in claim 1 wherein the providing means comprises:
   a digital interface that converts analog input signals into digital signals and digital signals into analog signals, the digital interface having an analog bus coupled to the controlling means over which the gain control signal is applied to the controlling means;
   means for interacting with the audio mixer to provide desired individual gain values and master gain values to the digital interface; and
   means for calculating from the individual and master gain values from the digital interface a total gain value that is input to the digital interface and output from the digital interface as the gain control signal.

* * * * *